Figure 1:
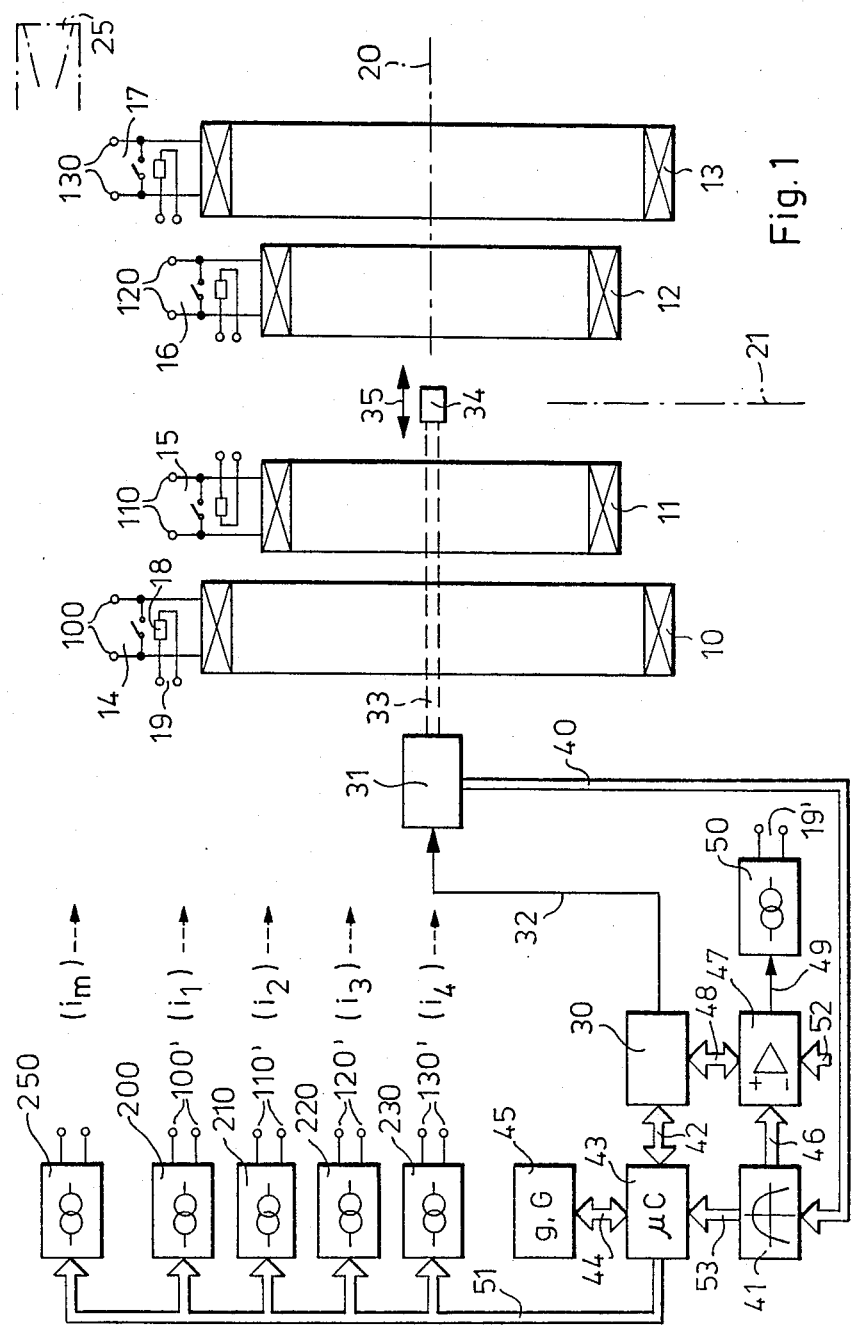

United States Patent [19]

Tschopp

[11] Patent Number: 4,683,434

[45] Date of Patent: Jul. 28, 1987

[54] METHOD FOR HOMOGENIZING THE FIELD OF A MAGNETIC COIL AND APPARATUS THEREFOR

[75] Inventor: Werner Tschopp, Forch, Switzerland

[73] Assignee: Spectrospin AG, Fallanden/Zurich, Switzerland

[21] Appl. No.: 843,216

[22] Filed: Mar. 24, 1986

[30] Foreign Application Priority Data

Mar. 28, 1985 [DE] Fed. Rep. of Germany ....... 3511303

[51] Int. Cl.[4] ............................................. G01R 33/20
[52] U.S. Cl. .................................... 324/320; 324/322
[58] Field of Search ............... 324/300, 318, 319, 322, 324/309, 320; 335/216; 336/DIG. 1

[56] References Cited

U.S. PATENT DOCUMENTS 4,173,775 11/1979 Kneip, Jr. ............................ 324/320
4,300,096 11/1981 Harrison et al. ..................... 324/309
4,623,844 11/1986 Macovski ............................ 324/320

FOREIGN PATENT DOCUMENTS 3328369 5/1983 Fed. Rep. of Germany.
3508332 8/1985 Fed. Rep. of Germany.

OTHER PUBLICATIONS

"Measurement and Control of Magnetic Field Homogeneity", The Review of Scientific Instruments, vol. 39, No. 7, Jul. 1968.

Primary Examiner—Stewart J. Levy
Assistant Examiner—Kevin D. O'Shea
Attorney, Agent, or Firm—Kokjer, Kircher, Bradley, Wharton, Bowman & Johnson

[57] ABSTRACT

A method and apparatus are proposed for homogenizing the field of a primary magnetic coil which can be energized from a primary current source and operated in a superconductive manner and short-circuited by means of superconducting switches. A profile of the uncorrected field of the primary coil is measured along an axis of the coil, and parameters for compensating fields are determined from the profile, with the compensating fields then being superimposed on the uncorrected field. In order to avoid the necessity of having to re-heat and then cool the primary coil for attachment of correcting windings for the compensating fields, the invention calls for separately energizable supplementary coils to be brought to a low temperature together with the primary coil, the field profile of the primary coil to be measured, the corresponding field gradients to be determined therefrom, and correcting currents for each individual supplementary coil to be determined therefrom and set, with the superconducting switches of the supplementary coils then being made.

8 Claims, 3 Drawing Figures

METHOD FOR HOMOGENIZING THE FIELD OF A MAGNETIC COIL AND APPARATUS THEREFOR

The present invention relates to a method for homogenizing the field of a primary magnetic coil which can be energized from a primary current source and operated in a superconductive manner and short-circuited by means of superconducting switches, in which a profile of the uncorrected field of the primary coil is measured along an axis of the coil, with parameters for compensating fields being determined from the profile and with the compensating fields then being superimposed on the uncorrected field.

Moreover, the present invention also relates to an apparatus for homogenizing the field of a primary magnetic coil which can be energized from a primary current source and operated in a superconductive manner and short-circuited by means of superconducting switches, comprising a magnetic field measuring device having a sensor which can be traversed along an axis of the coil and further comprising coil windings in addition to the primary coil.

Methods and apparatuses therefor of the type cited at the outset are known. They are employed, for example, to homogenize the field of superconductive coil systems which are employed for nuclear resonance measurements, in particular for nuclear spin tomography.

In the known methods and apparatuses, the fully wound primary coil was cooled to a superconductive temperature in liquid helium, with the nominal current then being applied. One or more field profiles were then measured, whereby "field profile", as employed herein, will be deemed to mean the course of the magnetic field along one or more axes of the coil. On the basis of the measured data of the field profile or profiles, various correcting coils were then calculated in the form of supplementary windings, which were later added to the primary coil and connected in series therewith. Since the number and location of the correcting windings depended upon the measurement results, it was first necessary to return the primary coil to room temperature and remove it from the cryostat in order to be able to attach the calculated supplementary windings.

The primary coil, together with the supplementary windings that were calculated and attached especially for the respective primary coil in question, was then placed in liquid helium again and cooled to a superconductive temperature, with the field profile or profiles then being again measured.

If it was then found that the field profile that was obtained still did not display the required homogeneity, it was necessary for the entire above-described procedure of calculation of the supplementary windings, heat-up, attachment of the supplementary windings, re-cooling and measurement to be repeated.

As a general rule, two to three, and occasionally even more, test cycles were necessary until a satisfactory result, i.e. a sufficiently high degree of homogeneity of the entire coil system, was attained.

However the above described known method, and the known apparatus therefor, were not only tedious and time-consuming; an additional factor was the fact that significant quantities of liquid helium were required to cool a coil system, especially in the case of coils involving large volumes, of the type that are employed in nuclear spin tomography, in order to be able to perform the above-described test cycles.

The manufacturers and/or operators of coil systems of this nature were therefore forced to either accept considerable helium vaporization losses or to install complicated helium recovery systems, as the cost of liquid helium is significant.

It is therefore the object of the present invention to further develop a method or an apparatus of the type cited at the outset in such a manner as to succeed in homogenizing a primary magnetic coil in a minimum of time and, in particular, without the necessity of repeated cool-down and heat-up of the coil system.

Pursuant to the method cited at the outset, this object is solved by means of the following steps according to the present invention:

(a) complementing the primary coil by at least two supplementary coils, the supplementary coils being separate from the primary coil, being able to be energized in a superconductive manner and each being able to be short-circuited by means of superconducting switches, with the supplementary coils having non-disappearing field gradients of at least the first to p'th order in the axis of the coils;

(b) cooling the primary coil and the supplementary coils to a temperature at which superconduction is possible;

(c) supplying the primary coil (25) with a nominal current ($i_m$);

(d) measuring the profile of the primary coil (25);

(e) determining the gradients ($G_1, \ldots, G_p$) of the primary coil (25) from the measured profile;

(f) determining the gradients ($g_{11}, \ldots, g_{pp}$) of the supplementary coils (10 to 13);

(g) determining correcting currents ($i_1, \ldots, i_p$) for the supplementary coils (10 to 13) from the following set of equations:

$$\sum_{n=1}^{p} g_{n1} i_1 = -G_1 i_m$$

$$\sum_{n=1}^{p} g_{n2} i_2 = -G_2 i_m$$

$$\vdots$$

$$\sum_{n=1}^{p} g_{np} i_p = -G_p i_m;$$

(h) supplying the correcting currents ($i_1, \ldots, i_p$) to the supplementary coils (10 to 13);

(i) making the superconducting switches (14 to 17) set the supplementary coils (10 to 13) to a persistance mode.

Pursuant to the apparatus cited at the outset, the object is solved in that the coil windings are designed in the form of supplementary coils with superconducting switches, the supplementary coils being able to be operated in a superconductive manner and separately from the primary coil, in that the supplementary coils are connected with a current source, in that an output of the magnetic field measuring device is connected with a field profile memory, and in that the field profile memory and a control unit are connected with a processor, whose outputs are connected with a gradient memory, as well as with the primary current source and the current sources for the supplementary coils.

The present invention thus fully solves the object upon which it is based, as the supplementary coils are assembled together with the primary coil right from the very beginning and are cooled to a superconductive temperature therewith. Determining the required correcting currents for each individual supplementary coil and supplying these correcting currents to the supplementary coils permits homogenization to be effected in the helium bath with purely electrical means, without the necessity of having to re-heat the coil system, and without having to first heat up and mechanically modify the coil system.

Since the required measurements and determinations can be performed relatively quickly, at least significantly more rapidly than mechanical conversion work, including heat-up and cool-down of the coil system, the field of the primary coil can not only be homogenized very quickly by means of the correcting coils; in addition, the considerable helium losses that are unavoidable for the reasons cited at the outset in the case of the known methods and apparatuses are eliminated.

Pursuant to a first embodiment of the method according to the present invention, the gradients of the supplementary coils are determined from the geometry thereof.

This measure offers the advantage of being able to calculate the gradients with sufficient accuracy in the case of a given geometry, i.e. dimensions and locations of the supplementary coils, in a known manner. While the supplementary coils also display a design error after they have been installed and excited, whose magnitude corresponds to the error of the primary coil, this does not have a disturbing effect in many cases, because the field of the supplementary coils is several magnitudes smaller than the field of the primary coil, and supplementary coil errors are only inputted into the primary field in appropriately reduced form (for example by a factor of $10^{-4}$).

In a further embodiment of the present invention, however, the gradients of the supplementary coils are determined by supplying the supplementary coils with a reference current, measuring their profiles and determining the gradients from the profiles.

This measure offers the advantage that geometrical errors in the supplementary coils have no effect in the case of maximum demands, as the calculations are based upon the actual, energized supplementary coils.

In a practical example of the present invention, the superconducting switches of the primary coil are made after the correcting currents have been supplied.

This measure provides the advantage of preventing the additionally energized supplementary coils from inducing into the primary coil, as their current is determined by the attached power supply unit until the last step of the method. Only when the final current has been applied to all coils are all superconducting switches thus made, thereby preventing any changes from occurring as a result of induced currents after the superconducting switches have made.

In a further embodiment of the method according to the present invention, on the contrary, the superconducting switch of the primary coil is already made after the nominal current has been supplied, the field of the primary coil is measured after the correcting currents have been supplied and steps (c) to (i) are repeated with a corrected nominal current should a given variance from a value that is dependent upon the nominal current be exceeded.

In this embodiment of the method, as opposed to the above-described embodiment, the risk is accepted that currents will be induced into the superconductive and persistent primary coil as a result of the late supply of the correcting currents to the supplementary coils. The marginal errors that result therefrom are eliminated again by means of a cyclical correction process, in which a somewhat higher nominal current is supplied to the primary coil during the next cycle, for example, if the primary field is weakened by the late supply of the correcting currents to the supplementary coils. However this embodiment of the method according to the present invention provides the advantage that the primary coil field remains stable longer, as it is not possible for fluctuations to occur as a result of a finite stability of the power supply unit after the primary coil has been made persistent.

According to a further development of the present invention, the steps of determining the field profiles, calculating the correcting currents and supplying the correcting currents can also be cyclically repeated, with homogenization being improved more and more on a step-by-step basis, until a given degree of homogeneity is achieved.

Although the employment of so-called shim coils for homogenizing insufficiently homogenous magnetic fields is known from the teachings of nuclear resonance experiments, these shim coils are based upon different principles than the supplementary coils of the present invention.

First of all, only very small specimen areas, as may be required for specimen dimensions that generally correspond to the dimensions of a test tube, are customarily homogenized with the known type of shim coils. Moreover, the design of the known shim coils is such that one coil system is intended for a gradient of a given order, and for this gradient only, as this shim coil system produces only a gradient of this one order, and not gradients of any other order.

In the case of a shim coil system for a third-order gradient ($Z^3$), those systems termed as "orthogonal" shim coils comprise symmetrical pairs of coils; consequently, the even-order gradients ($Z^2$, $Z^4$, . . . ) disappear for reasons of symmetry. In this example, it is possible to select the positioning of the pairs of coils for third-order gradients ($Z^3$) in such a manner that the first- and fifth-order gradients ($Z$, $Z^5$) also disappear. In this manner, the pair of coils for the third-order gradients ($Z^3$) cited by way of example produce only a pure third-order field gradient, without influencing the optimum setting of the shim coil systems for gradients of other orders.

In the case of conventional nuclear resonance experiments, the individual gradients can thus be optimized one after the other As already mentioned, a system of shim coils is necessary as a result of the required orthogonality condition for each individual field gradient; 16 coils are required to reset four desired field gradients, for example.

However highly complex coil systems of this nature are unserviceable for the predominating application of the present invention in coils for nuclear spin tomography measurements, since thick coil packages would be required as a result of the large specimen volume, which represents the dimensions of a human body in the case of full-body tomography.

While shim coils are employed for these applications, as well, for reasons of cost they are of significantly flatter design than would actually be required. Consequently, the correction range of shim coils of this nature is highly restricted. In actual practice, for example, it would be necessary to provide a coil package with a thickness of 1 cm as "true" shims in the case of a 3 cm thick solenoid coil having a diameter of 50 cm, which would result in an enormous increase in cost in view of the fact that superconductive wire is very expensive. Consequently, only very thin supplementary coils, with a correspondingly reduced correction range, are employed.

The present invention thus differs from the known arrangements incorporating shim coil systems by intentionally eliminating the orthogonality condition and permitting each supplementary coil to produce all field gradients that are to be reset, for example all field gradients from the first to the fourth order (Z to $Z^4$).

By varying the positioning of each supplementary coil, however, the distribution of the magnitudes of these gradients differs from supplementary coil to supplementary coil.

By measuring the field profile, determining the required correcting currents and supplying the correcting currents, all desired gradients are able to be compensated "at one fell swoop", and—depending upon the complexity of the method, or apparatus, employed—homogenization can be effected all the way to high-order field gradients.

Figure 2:
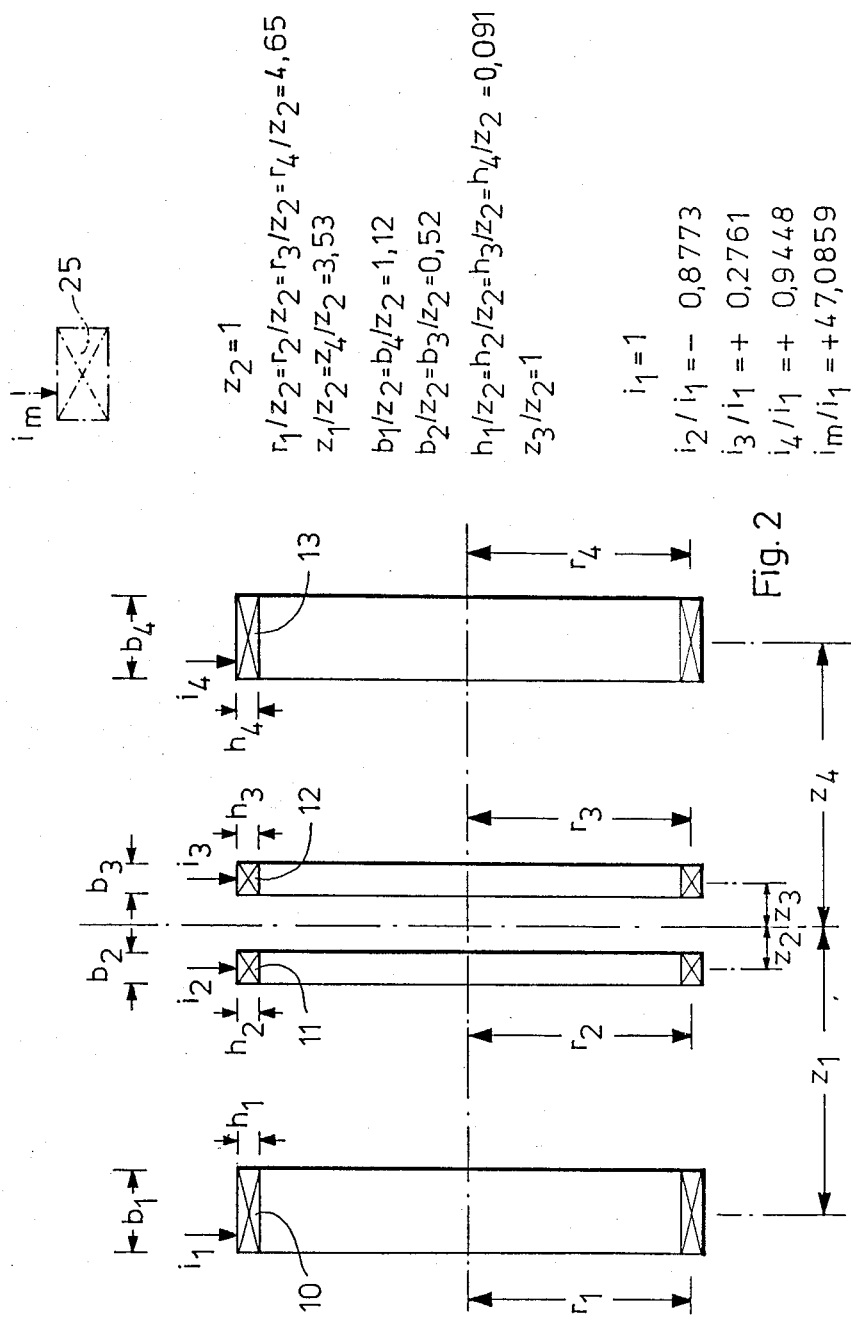
Figure 3:
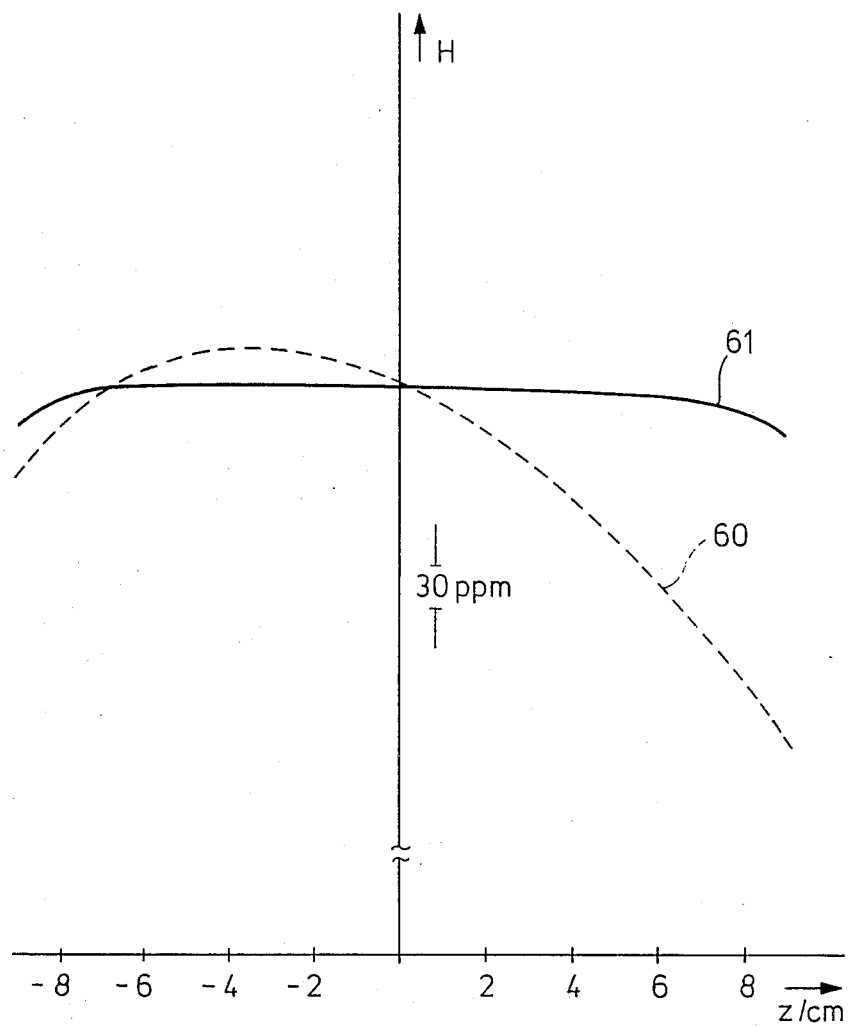

The above discussed and other objects, features and advantages of the present invention will become more apparent from the following description thereof, when taken in connection with the practical examples shown in the accompanying drawings, in which FIG. 1 shows a block schematic diagram of an apparatus according to the present invention, of the type that can be employed for implementation of the method according to the present invention;

FIG. 2 shows a dimensioning example for a system of supplementary coils according to the present invention; and FIG. 3 shows the axial curve of a magnetic field, both with and without homogenization according to the present invention.

Referring now to the drawings, where like reference numerals designate like parts throughout the several views, the numerals 10, 11, 12 and 13 in FIG. 1 denote four supplementary coils, with supplementary coils 10 and 13, as well as supplementary coils 11 and 12, being arranged in pairs, even though this is not necessary under the scope of the present invention.

Although there is, in principle, complete freedom with respect to geometry, i.e. the location and dimensions of the supplementary coils, within the scope of the present invention as long as the field gradients thereof, up to the highest order of the primary field gradient to be corrected, do not disappear, in actual practice the supplementary coils will be arranged in such a manner that the first even-order gradient thereof which must no longer be corrected will disappear. If, for example, compensation is desired for the gradients of the first through the fourth order, the geometry of the supplementary coils will be employed in such a manner as to cause their sixth-order gradients to disappear.

Supplementary coils 10, 11, 12, 13 have connections 100, 110, 120, 130, which can be short-circuited by means of superconducting switches 14, 15, 16, 17. Disposed for this purpose are heater resistors, one of which is denoted 18, with its connections 19. When energized, heater resistor 18 heats the spatial area of superconducting switch 14 in a known manner, thereby causing this area to assume the status of a normal line. In this case, supplementary coil 10 can be supplied with current externally by means of terminals 100. If energization of heating resistor 18 is terminated, superconducting switch 14, which is contained in liquid helium, will attain a superconductive temperature and short-circuit supplementary coil 10, which will then operate in the persistent mode.

The longitudinal axis (z) of the coil system is denoted 20, and a vertical axis (x, y) is denoted 21. The primary magnetic field coil, which can be arranged either inside or outside of supplementary coils 10 to 13, is suggested by the notation 25 in FIG. 1.

Homogenization of the field of primary coil 25 is effected by means of the circuitry shown schematically in the lower half of FIG. 1.

A control unit 30 controls a magnetic field measuring device 31 by means of a control line 32. Magnetic field measuring device 31 has a traversable rod 33, with a sensor 34, which is sensitive to magnetic fields, being disposed at the end thereof and being able to be traversed in the direction of doubled-headed arrow 35, i.e. in the direction of longitudinal axis 20, by means of a drive that is left unillustrated in FIG. 1.

The measured values that are scanned in this manner along longitudinal axis 20, i.e. the field profile in the z-direction, are written into a field profile memory 41 by means of a data line 40. Control unit 30 is connected with a processor 43 by means of a further data line 42; processor 43, in turn, is attached to a gradient memory 45 by means of a further data line 44. A data line 46 connects field profile memory 41 with a comparator 47, which interacts conjointly with control unit 30 by means of a data line 48, on the one hand, and, on the other, is further attached to a current source 50 by means of a control line 49, and to which, finally, a set-point value can be supplied via a data input 52. The field profile memory is also attached to processor 43 by means of a data line 53, with the output of processor 43 being connected with a primary current source 250, as well as four current sources 200, 210, 220, 230, by means of a data line 51.

A current $i_m$ can be tapped for primary coil 25 at the output of primary current source 250, and outputs 100', 110', 120', 130' of current sources 200, 210, 220, 230 are connected with connections 100, 110, 120, 130 of supplementary coils 10, 11, 12, 13, thereby permitting correcting currents $i_1, i_2, i_3, i_4$ to be fed thereinto.

It is obvious that the practical example shown in FIG. 1, incorporating four supplementary coils 10 to 13, should only be viewed by way of example and that arrangements with a greater or lesser number of supplementary coils, and a corresponding number of current sources, can also be employed without leaving the scope of the present invention.

The theory of operation of the arrangement shown in FIG. 1 and the method performed therewith is as follows:

The entire coil system, including primary coil 25 and supplementary coils 10, 11, 12, 13, is placed, fully assembled, in a cryostat and cooled to the temperature of liquid helium in order to place it in a state in which superconductivity is possible in primary coil 25 and in supplementary coils 10, 11, 12, 13.

Through actuation of superconducting switches 18, all coils can also be connected, in this state, with current sources 250, 200, 210, 220, 230, with the current passing therethrough consequently being determined by the current sources.

By means of processor 43 and data line 51, control unit 30 now sets the current sources in such a manner as to operate primary coil 25 with nominal current $i_m$, while keeping supplementary coils 10 to 13 currentless.

Magnetic field measuring device 31 is now energized by means of control line 32, and sensor 34 traverses the coil system along longitudinal axis 20. The corresponding measured values are entered into field profile memory 41 by means of data line 40 until the field profile has been completely scanned.

A process is now initiated in processor 43 via data line 42; this process determines gradients $G_0$, $G_1$, $G_2$, $G_3$, $G_4$ ... in a known manner from the measured field profile. These measured field gradients of the field of the primary coil are then stored in gradient memory 45. Control unit 30 now terminates nominal current $i_m$ to primary coil 25 and applies a reference current to one of the supplementary coils, for example to supplementary coil 10, via current source 200. The field profile for this one supplementary coil can now be scanned in the above-described manner, with the field gradients $g_{10}$, $g_{11}$, $g_{12}$, $g_{13}$, $g_{14}$ ... being determined and stored in gradient memory 45.

The field profiles and field gradients of all supplementary coils 10 to 13 are then determined in a corresponding manner, one after the other.

It must, however, be emphasized that this procedure should only be viewed by way of example, permitting the respective field gradients G, g to be determined in an especially simple manner; it is obvious that other procedures would also be conceivable, in which a plurality of coils are energized simultaneously, with field gradients G, g being determined by means of correspondingly more sophisticated methods. Without leaving the scope of the present invention, it is also possible to calculate gradients $g_{11}$ ..., $g_{pp}$ of supplementary coils 10 to 13 from the geometry of supplementary coils 10 to 13.

The step that follows makes use of the following consideration:

If the magnetic fields that are produced by supplementary coils 10, 11, 12, 13 are denoted $H_1$, $H_2$, $H_3$ and $H_4$, the magnetic field that is produced at the point of intersection between axes 20, 21 can be portrayed by means of a series expansion:

$$H_1 = (g_{10} + g_{11}z + g_{12}z^2 + g_{13}z^3 + g_{14}z^4 + \ldots)i_1$$

$$H_2 = (g_{20} + g_{21}z + g_{22}z^2 + g_{23}z^3 + g_{24}z^4 + \ldots)i_2$$

$$H_3 = (g_{30} + g_{31}z + g_{32}z^2 + g_{33}z^3 + g_{34}z^4 + \ldots)i_3$$

$$H_4 = (g_{40} + g_{41}z + g_{42}z^2 + g_{43}z^3 + g_{44}z^4 + \ldots)i_4$$

Correspondingly, the following expansion applies for the field of primary coil 25 at the point of intersection between axes 20, 21:

$$H_m = (G_0 + G_1z + G_2z^2 + G_3z^3 + G_4z^4 + \ldots)i_m$$

If, in the case of the fourth-order system cited above by way of example, or, put in general terms, in the case of a p'th order system, gradients $G_1$–$G_p$ of primary coil 25 are to be compensated by gradients $g_{11}$ to $g_{pp}$ of correcting coils 10 to 13, the following must apply:

$$g_{11}i_1 + g_{21}i_2 + g_{31}i_3 + g_{41}i_4 = -G_1 i_m$$

$$g_{12}i_1 + g_{22}i_2 + g_{32}i_3 + g_{42}i_4 = -G_2 i_m$$

$$g_{13}i_1 + g_{23}i_2 + g_{33}i_3 + g_{43}i_4 = -G_3 i_m$$

$$g_{14}i_1 + g_{24}i_2 + g_{34}i_3 + g_{44}i_4 = -G_4 i_m$$

As can be seen, only one p system, e.g. four equations with p, e.g. four unknowns, must be solved in order to determine the required correcting currents $i_1$, $i_2$, $i_3$, $i_4$, which is possible without any significant difficulty.

On the basis of instructions from control unit 30, processor 43 can now calculate correcting currents $i_1$, $i_2$, $i_3$, $i_4$ in the above described manner form the data stored in gradient memory 45 and set current sources 200, 210, 220, 230 in such a manner, via data line 51, that respectively corresponding correcting currents $i_1$, $i_2$, $i_3$, and $i_4$ flow through supplementary coils 10, 11, 12, 13.

In a further step, control unit 30 now causes magnetic field measuring device 31, with sensor 34, to again scan the axial field profile and store it in field profile memory 41. The profile of the corrected field is now supplied via data line 46 to comparator 47, at whose data input 52 a reference value is applied. Control unit 30 now queries comparator 47 as to whether the given setpoint value has already been reached and, should this not be the case, causes the procedure to be repeated in order to superimpose minor correcting currents on correcting currents $i_1$, $i_2$, $i_3$, $i_4$ in a second, fine correction step.

If necessary, this procedure can be repeated a plurality of times until comparator 47 signals that the desired homogeneity value stipulated at data input 52 has been attained. Current source 50, and thus heater resistors 18, are now de-energized by means of control line 49, and superconducting switches 14, 15, 16, 17 set supplementary coils 10, 11, 12, 13, as well as primary coil 25, to the persistent mode.

According to the present invention, it is also possible to set primary coil 25 to the persistent mode immediately after nominal current $i_m$ has been supplied in order to utilize the high stability of superconductive primary coil 25 for the subsequent steps. However, in this case, it is necessary to determine whether the subsequent supply of correcting currents $i_1$ to $i_4$ to supplementary coils 10 to 13 caused partial currents to be induced into primary coil 25, which would modify the primary field by an interfering amount. Should this be the case, it would be necessary for the procedure to be repeated with a corrected nominal current $i'_m$.

FIG. 2 shows a calculated practical example, with four supplementary coils 10, 11, 12, 13; once again, coils 10, 13 and 11, 12 have been arranged in pairs, one relative to the other. In the practical example, radii $r_1$, $r_2$, $r_3$, $r_4$ of the centers of the coil packages are equidistant from longitudinal axis 20. Heights $h_1$, $h_2$, $h_3$, $h_4$ of the coil packages are also of equal magnitude in all four coils, and widths $b_1$, $b_4$ of coil pair 10, 13, as well as widths $b_2$, $b_3$ of coil pair 11, 12, are also the same size in each pair of coils.

Standardized to the radial clearance $z_2$ of coil 11 from the point of intersection of axes 20, 21, the following applies for the remaining dimensions of the correcting coil system:

$$r_1/z_2 = r_2/z_2 = r_3/z_2 = r_4/z_2 = 4.65$$

$z_1/z_2 = z_4/z_2 = 3.53$ $b_1/z_2 = b_4/z_2 = 1.12$ $b_2/z_2 = b_3/z_2 = 0.52$ $h_1/z_2 = h_2/z_2 = h_3/z_2 = h_4/z_2 = 0.091$ $z_3/z_2 = 1$

If correcting current $i_1$ in supplementary coil 10 is employed as a reference parameter, the following applies with respect to the remaining currents, in standardized notation:

$i_2/i_1 = -0.8773$ $i_3/i_1 = +0.2761$ $i_4/i_1 = -0.9448$ $i_m/i_1 = +47.0859$

The result of homogenization with a correcting coil system according to FIG. 2 is shown in FIG. 3.

The field profile 60, represented by means of the dashed line, corresponds to the profile of the uncorrected primary field that is produced by 25. Following performance of the method according to the present invention, or by means of the apparatus according to the present invention, the above, numerically expressed values occurred that were cited by way of example, with profile 61 of the corrected field, represented by means of the solid line, resulting therefrom.

It can clearly be seen that a significant enhancement of homogeneity, on the order of several magnitudes, was achieved, as an inhomogeneity of the corrected field of only a few ppm ($10^{-6}$) can be seen in an axial specimen area of several centimeters, while the inhomogeneity amounts to over 100 ppm ($10^{-4}$) in the case of the uncorrected field.

The present invention has been described above on the basis of preferred practical examples thereof. Obviously, many modifications and variations of the present invention are possible in the light of the above teachings. It should therefore be understood that within the scope of the appended claims, the present invention may be practiced otherwise than as specifically described. In particular, individual characteristics of the invention can be employed individually or in combination one with the other. However it should be understood that, within the scope of the present invention, no protection is desired for any steps of the method, in themselves, in which computing operatings are required as interim steps.

What is claimed is:

1. A method for homogenizing the field of a primary magnetic coil which can be energized from a primary current source and operated in a superconductive manner and shortcircuited by means of superconducting switches, in which a profile of the uncorrected field of said primary coil is measured along an axis of said coil, with parameters for compensating fields being determined from said profile and with said compensating fields then being superimposed on said uncorrected field, wherein said method comprises the steps of (a) complementing said primary coil by at least two supplementary coils, said supplementary coils being separate from said primary coil, being able to be energized in a superconductive manner and each being able to be short-circuited by means of superconducting switches, said supplementary coils having non-disappearing field gradients of at least the first to p'th order in the axis of said coils;

(b) cooling said primary coil and said supplementary coils to a temperature at which superconduction is possible;

(c) supplying said primary coil with a nominal current ($i_m$);

(d) measuring the profile of said primary coil;

(e) determining the gradients $G_1 \rightarrow G_p$ of said primary coil from said measured profile;

(f) determining the gradients ($g_{n1} \rightarrow g_{np}$) of said supplementary coils;

(g) determining correcting currents ($i_1 \rightarrow i_p$) for said supplementary coils from the following set of equations:

$$\sum_{n=1}^{p} g_{n1} i_1 = -G_1 i_m$$

$$\sum_{n=1}^{p} g_{n2} i_2 = -G_2 i_m$$

$$\cdot \quad \cdot$$
$$\cdot \quad \cdot$$

$$\sum_{n=1}^{p} g_{np} i_p = -G_p i_m;$$

(h) supplying said correcting currents to said supplementary coils;

(i) making said, superconducting switches set said supplementary coils to a persistence mode.

2. The method according to claim 1, wherein said gradients of said supplementary coils are determined from the geometry thereof.

3. The method according to claim 1, wherein said gradients of said supplementary coils are determined by supplying said supplementary coils with a reference current, measuring their profiles and determining said gradients from said profiles.

4. The method according to claim 1, wherein said superconducting switch of said primary coil is made after said correcting currents have been supplied.

5. The method according to claim 1, wherein said superconducting switch of said primary coil is made after said nominal current has been supplied, the field of said primary coil is measured after said correcting currents have been supplied and steps (c) to (i) are repeated with a corrected nominal current should a given variance from a value that is dependent upon the nominal current be exceeded.

6. The method according to claim 1, wherein steps (d) to (i) are cyclically repeated until a given variance of said profile of said corrected primary field from a given reference profile has been achieved.

7. An apparatus for homogenizing the field of a primary magnetic coil which can be energized from a primary current source and operated in a superconductive manner and short-circuited by means of superconducting switches, comprising a magnetic field measuring device having a sensor which can be traversed along an axis of said coil and further comprising coil windings in addition to said primary coil, wherein said coil windings are designed in the form of supplementary coils with superconducting switches, said supplementary coils being able to be operated in a superconductive manner and separately from said primary coil, wherein said supplementary coils are connected with a current source, wherein an output of said magnetic field measuring device is connected with a field profile memory, and wherein said field profile memory and a control unit are connected with a processor, whose outputs are connected with a gradient memory, as well as with said primary current source and said current source for said supplementary coils.

8. The apparatus according to claim 7, wherein each supplementary coil is connected with a separate current source.

* * * * *